(12) United States Patent
Lee et al.

(10) Patent No.: US 11,769,270 B2
(45) Date of Patent: Sep. 26, 2023

(54) METHOD AND APPARATUS FOR MEASURING ECCENTRICITY OF BLIND VIA HOLE FORMED IN PRINTED CIRCUIT BOARD

(71) Applicant: SMART RADAR SYSTEM, INC., Seongnam-si (KR)

(72) Inventors: Jae Yong Lee, Anyang-si (KR); Yeon Hee Song, Seoul (KR)

(73) Assignee: SMART RADAR SYSTEM, INC., Seongnam-si (KR)

( * ) Notice: Subject to any disclaimer, the term of this patent is extended or adjusted under 35 U.S.C. 154(b) by 58 days.

(21) Appl. No.: 17/577,392

(22) Filed: Jan. 18, 2022

(65) Prior Publication Data

US 2023/0252665 A1 Aug. 10, 2023

(51) Int. Cl.
*G06T 7/00* (2017.01)
*G06T 7/60* (2017.01)
*H05K 3/46* (2006.01)
*H05K 3/36* (2006.01)

(52) U.S. Cl.
CPC .............. *G06T 7/60* (2013.01); *H05K 3/361* (2013.01); *H05K 3/4626* (2013.01); *G06T 2207/30141* (2013.01); *G06T 2207/30204* (2013.01)

(58) Field of Classification Search
CPC ... H01L 21/385; H01L 29/7869; C23C 14/08; G06F 21/31; H04L 9/3263; H04L 9/3234; G06K 9/00577; G01S 7/4817; G02F 1/1368
See application file for complete search history.

(56) References Cited

U.S. PATENT DOCUMENTS

2016/0073505 A1* 3/2016 Yu ........................... H05K 3/007 216/17
2020/0380654 A1* 12/2020 Ratner .................... G06T 7/001

* cited by examiner

*Primary Examiner* — Phuoc H Doan
(74) *Attorney, Agent, or Firm* — INSIGHT LAW GROUP, PLLC; Seung Lee (57) ABSTRACT

Provided is a method of measuring eccentricity of a blind via hole formed in a printed circuit board including an inner-layer board and an outer-layer board that are bonded by thermocompression bonding. The method includes acquiring, by a microscope camera, an image by photographing a marker which is formed on a surface of the outer-layer board and a blind via hole which is exposed upward through a marker hole formed in a center of the marker with a microscope camera, and measuring, by computing equipment connected to the microscope camera, eccentricity indicating a separation distance and a separation direction from central coordinates of the marker hole to central coordinates of the blind via hole using a distance between an end point of the marker hole and an end point of the blind via hole which are included in the image.

18 Claims, 8 Drawing Sheets

MEASURE RADIUS OF EACH CIRCLE
Ra = RADIUS OF MARKER HOLE
Rb = RADIUS OF BVH

METHOD AND APPARATUS FOR MEASURING ECCENTRICITY OF BLIND VIA HOLE FORMED IN PRINTED CIRCUIT BOARD

BACKGROUND

1. Field

The present invention relates to a technique for determining a manufacturing tolerance of an actually used via hole by measuring eccentricity of a blind via hole formed in a printed circuit board.

2. Description of Related Art

Transmission lines, such as striplines, microstrip lines, co-planar waveguides, and the like, are used to transmit radio frequency (RF) signals with low loss.

The characteristic impedance of a transmission line is affected by a surrounding via hole. In particular, eccentricity of a via hole causes a deviation in characteristic impedance, and there is a concern that an electromagnetic wave reflection loss caused by the deviation in characteristic impedance may increase.

Figure 1:
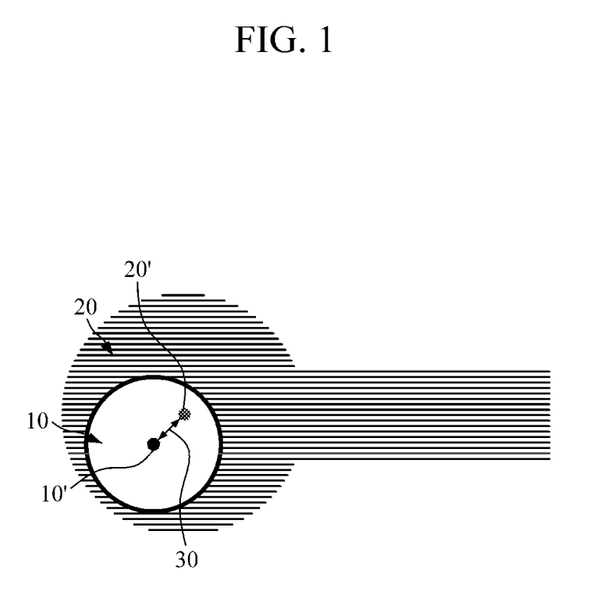
FIG. 1 is a diagram for describing problems of the related art.

Here, as illustrated in FIG. 1, the eccentricity of a via hole refers to a difference 30 between a center 10' of a via hole 10 and a center 20' of an annular pad (annular ring) 20 electrically connected to the via hole 10.

When the eccentricity 30 of the via hole is severe, a loss caused by a deviation in characteristic impedance of a transmission line increases, which acts as a factor to reduce electromagnetic wave reception sensitivity or transmission output.

Causes of the eccentricity of a via hole are as follows.

A printed circuit board on which an antenna and a transmission line are designed is composed of an inner-layer board and an outer-layer board, and an electromagnetic wave circuit including an antenna and a transmission line is designed on a surface of the outer-layer board.

Such a printed circuit board is manufactured by manufacturing the inner-layer board first and then thermocompression bonding the manufactured inner-layer board to the outer-layer board.

However, the outer-layer board is made of a low-loss and low-k material such as a Teflon material to reduce a propagation loss, whereas the inner-layer board is made of a material such as flame retardant (FR) 4.

The Teflon material and the FR4 material have different stretch rates. Therefore, when the Teflon material and the FR4 material are bonded by thermocompression bonding, the eccentricity occurs between a position of the annular pad (annular ring) 20 connected to the via hole 10 and a position of a drill hole for forming the via hole 10 due to thermal expansion and contraction that is generated during compression.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The present invention is directed to providing a method and apparatus for measuring eccentricity of a blind via hole (BVH) formed in a printed circuit board (PCB), in which eccentricity of the BVH is calculated using a BVH that does not function as an actual via hole in the PCB and a BVH marker formed thereon.

Ultimately, the calculated eccentricity is used as information for PCB manufacturers to adjust process parameters in the manufacturing process of PCBs.

The above-described objects, other objects, advantages, and features of the present invention and methods of achieving the same will be clearly understood with reference to the accompanying drawings and the following detailed embodiments.

In one general aspect, a method of measuring eccentricity of a blind via hole formed in a printed circuit board, which includes acquiring, by a microscope camera, an image by photographing a marker which is formed on a surface of the outer-layer board and a blind via hole which is exposed upward through a marker hole formed in a center of the marker with a microscope camera, and measuring, by computing equipment connected to the microscope camera, eccentricity indicating a separation distance and a separation direction from central coordinates of the marker hole to central coordinates of the blind via hole using a distance between an end point of the marker hole and an end point of the blind via hole which are included in the image.

In another general aspect, a method of measuring eccentricity of a blind via hole formed in a printed circuit board, which includes acquiring, by a microscope camera, an image by photographing a marker which is formed on a surface of the outer-layer board and a blind via hole which is exposed upward through a marker hole formed in a center of the marker with a microscope camera, and measuring, by computing equipment connected to the microscope camera, eccentricity indicating a separation distance and a separation direction from central coordinates of the marker hole to central coordinates of the blind via hole using a distance between an end point of the marker hole and an end point of the blind via hole which are included in the image, wherein the measuring of the eccentricity includes measuring, by a processor included in the computing equipment, the eccentricity using a curvature of the blind via hole and a curvature of the marker hole which appear on the image when only a portion of an entire circular shape of the blind via hole is exposed upward by the marker.

In still another general aspect, an apparatus for measuring eccentricity of a blind via hole formed in a printed circuit board, which includes a microscope camera configured to acquire an image by photographing a marker which is formed on a surface of the outer-layer board and a blind via hole which is exposed upward through a marker hole formed in a center of the marker with a microscope camera, and computing equipment configured to receive the image acquired by the microscope camera and measure eccentricity indicating a separation distance and a separation direction from central coordinates of the marker hole to central coordinates of the blind via hole using a distance between an end point of the marker hole and an end point of the blind via hole which are included in the image.

In yet another general aspect, an apparatus for measuring eccentricity of a blind via hole formed in a printed circuit board is an apparatus for measuring eccentricity of a blind via hole formed in a printed circuit board including an inner-layer board made of a flame retardant (FR) 4 material and an outer-layer board made of a Teflon material which are bonded by thermocompression bonding, the apparatus including a microscope camera configured to acquire an image by photographing a marker which is formed on a surface of the outer-layer board and a blind via hole which is exposed upward through a marker hole formed in a center of the marker with a microscope camera, and computing equipment configured to receive the image from the microscope camera and measure eccentricity indicating a separation distance and a separation direction from central coordinates of the marker hole to central coordinates of the blind via hole using a distance between an end point of the marker hole and an end point of the blind via hole which are included in the image, wherein the computing equipment measures the eccentricity using a curvature of the blind via hole and a curvature of the marker hole which appear on the image when only a portion of an entire circular shape of the blind via hole is exposed upward by the marker.

Other features and aspects will be apparent from the following detailed description, the accompanying drawings, and the claims.

Throughout the accompanying drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Specific structural and functional descriptions of embodiments of the present invention disclosed in this specification are only for the purpose of describing the embodiments of the present invention, and the embodiments of the present invention may be embodied in various forms and are not to be construed as limited to the embodiments described in this specification.

While the embodiments of the present invention may be modified in various ways and take on various alternative forms, specific embodiments thereof are shown in the accompanying drawings and described in detail in this specification. There is no intent to limit the present invention to the particular forms disclosed. On the contrary, the present invention is to cover all modifications, equivalents, and alternatives falling within the spirit and scope of the appended claims.

The terminology used herein is for the purpose of describing particular embodiments only and is not intended to be limiting to the present invention. As used herein, the singular forms "a" and "an" are intended to also include the plural forms, unless the context clearly indicates otherwise. It should be further understood that the terms "comprise," "comprising," "include," and/or "including," when used herein, specify the presence of stated features, integers, steps, operations, elements, parts, or combinations thereof, but do not preclude the presence or addition of one or more other features, integers, steps, operations, elements, parts, or combinations thereof.

Hereinafter, embodiments will be described in detail with reference to the accompanying drawings. However, the scope of the patent application is not limited or restricted by these embodiments. Like reference numerals in the accompanying drawings refer to like elements.

Figure 2:
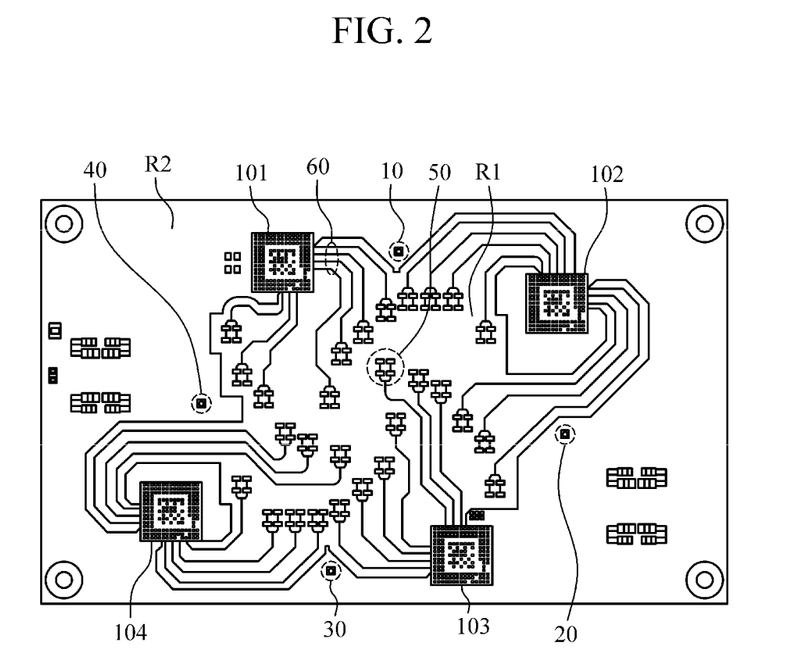
FIG. 2 is a photograph showing an actually manufactured printed circuit board according to an embodiment of the present invention.

FIG. 2 is a photograph showing an actually manufactured printed circuit board (PCB) according to an embodiment of the present invention and is for describing positions of a blind via hole (BVH) and a BVH marker.

Referring to FIG. 2, the PCB is divided into an antenna region R1 and a peripheral region R2 that surrounds or is adjacent to the antenna region R1.

In the antenna region R1, quadrangular patch antennas 50 that are connected to each other like a bunch of grapes and transmission lines that connect the patch antennas 50 to a chip are formed (patterned).

In the antenna region R1 and the peripheral region R2, a region 101 in which the chip is mounted and regions 10, 20, and 30 in which a BVH and a BVH marker formed thereon are formed are defined.

Figure 3:
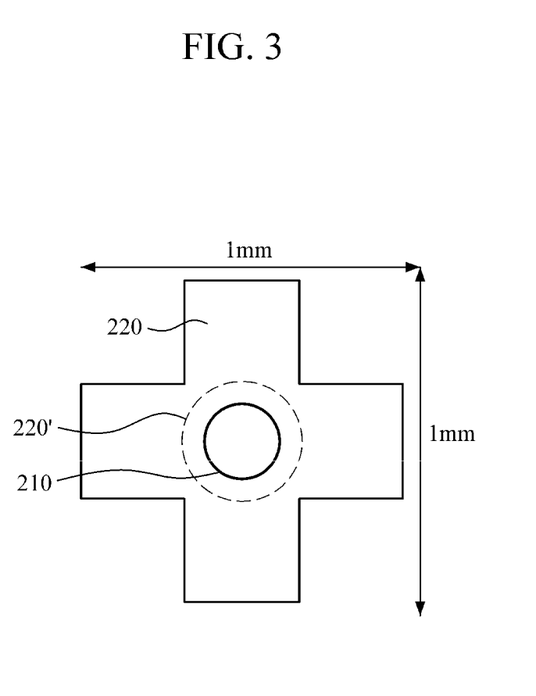
FIG. 3 is a diagram illustrating shapes of a blind via hole (BVH) and a BVH marker formed thereon according to an embodiment of the present invention.
Figure 4:
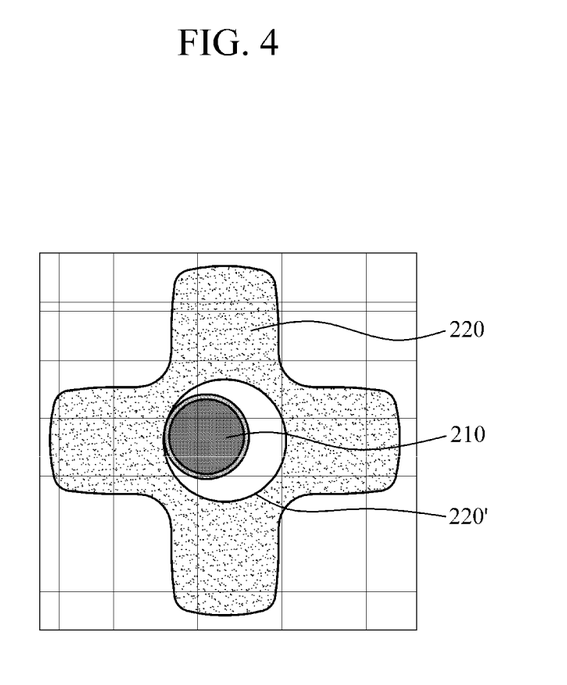
FIG. 4 is a photographic image obtained by actually photographing a region in which the BVH and the BVH marker formed thereon shown in FIG. 2 are formed with an optical microscope.

FIG. 3 is a diagram illustrating shapes of a BVH and a BVH marker formed thereon according to an embodiment of the present invention, and FIG. 4 is a photographic image obtained by actually photographing a region in which the BVH and the BVH marker formed thereon shown in FIG. 2 are formed with an optical microscope.

First, referring to FIG. 3, a BVH 210 does not function as an actual via hole but may be a dummy via hole used only for measuring eccentricity of the actual via hole.

Therefore, the BVH 210 is formed in the same process as the actual via hole.

As illustrated in FIG. 3, a BVH marker 220 may be formed on the BVH 210 and may be formed (patterned) in a shape of a cross and made of a copper material.

Further, a circular opening 220' through which the BVH 210 is exposed upward is formed at a center of the BVH marker 220. Hereinafter, the opening formed at the center of the BVH marker 220 is referred to as a "BVH marker hole" or as a "marker hole" for short.

In FIG. 3, although the cross-shaped BVH marker 220 is shown, the present invention is not limited thereto, and the BVH marker 220 may be patterned in various shapes. For example, the BVH marker 220 may be patterned in one of various polygonal shapes such as a quadrangular shape, a circular shape, a triangular shape, and the like.

When the BVH marker 220 is formed in a cross shape, a quadrangular shape, a circular shape, or a triangular shape, the BVH marker 220 may be designed to have a lateral length of 1 mm and a longitudinal length of 1 mm.

The photographic image shown in FIG. 4 is a photographic image obtained by photographing a situation in which a center of the BVH 210 is eccentric in a nine o'clock direction with respect to a center of the BVH marker hole 220'.

Figure 5:
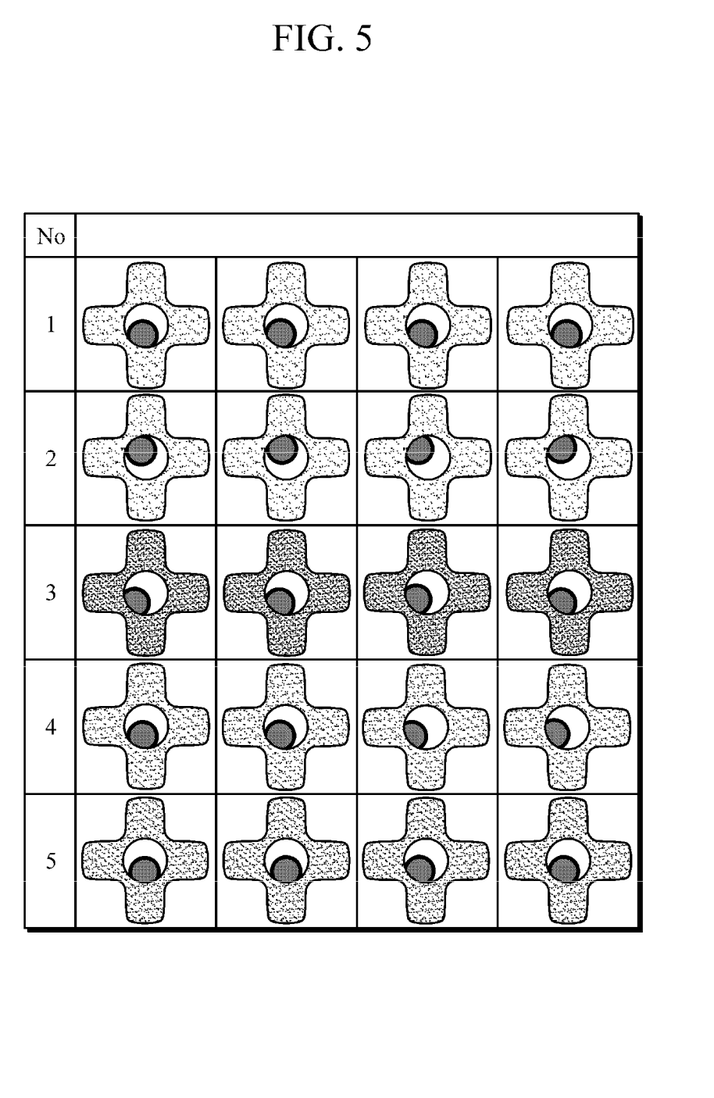
FIG. 5 shows photographic images obtained by actually photographing a BVH which is eccentric in various directions from a center of a BVH marker hole with an optical microscope according to an embodiment of the present invention.

FIG. 5 shows photographic images obtained by actually photographing a BVH which is eccentric in various directions from a center of a BVH marker hole with an optical microscope according to an embodiment of the present invention.

In FIG. 5, No. 1 shows photographs obtained by photographing a situation in which a center of the BVH is eccentric in a seven o'clock direction with respect to a center of the BVH marker hole.

No. 2 shows photographs obtained by photographing a situation in which the center of the BVH is eccentric in an eleven o'clock direction with respect to the center of the BVH marker hole.

No. 3 and 4 show photographs obtained by photographing a situation in which the center of the BVH is eccentric in a seven o'clock direction with respect to the center of the BVH marker hole, that is, a situation in which a degree of the eccentricity is greater than that of No. 1 so that the BVH is more obscured by a BVH marker.

No. 5 shows photographs obtained by photographing a situation in which the center of the BVH is eccentric in a six o'clock direction with respect to the center of the BVH marker hole.

Hereinafter, a method of measuring eccentricity of a BVH will be described in detail.

Figure 6:
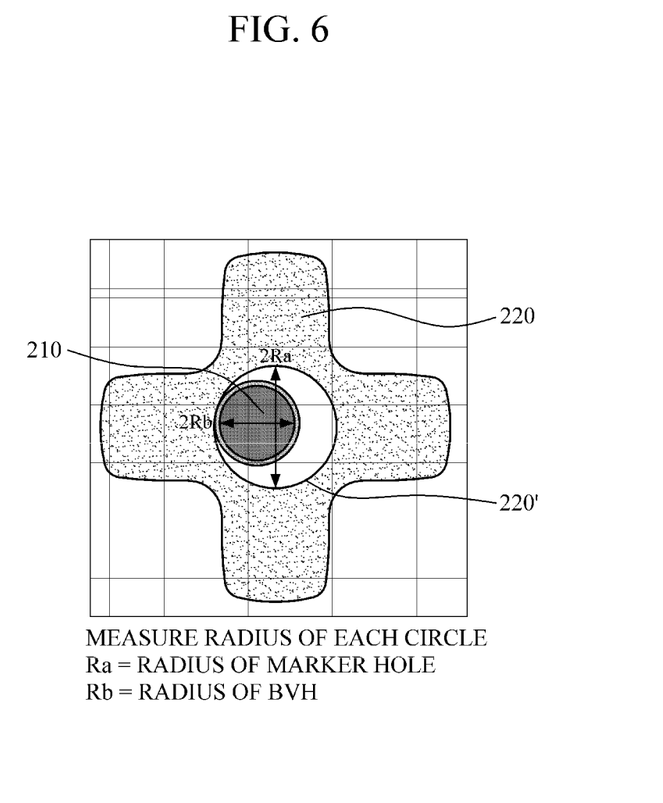
FIGS. 6 and 7 are photographic images for describing a method of measuring eccentricity of a BVH according to an embodiment of the present invention.
Figure 7:
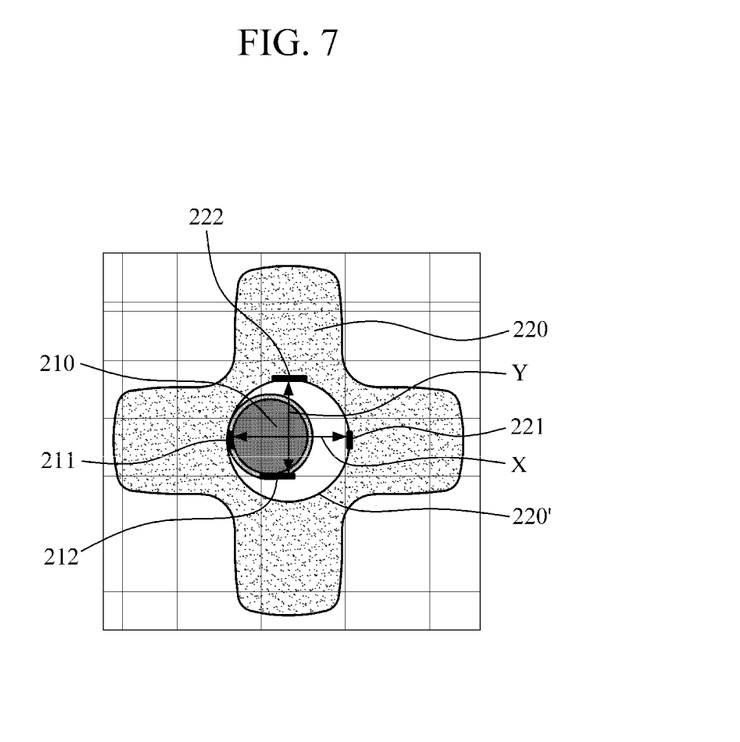

FIGS. 6 and 7 are diagrams for describing a method of measuring eccentricity of a BVH.

First, in order to measure the eccentricity of the BVH, an image of a BVH marker is acquired by photographing the BVH marker formed on a surface of an outer-layer board using a charge-coupled device (CCD) or complementary metal-oxide-semiconductor (CMOS) type microscope camera.

The acquired image is transmitted to computing equipment connected to the microscope camera, and the computing equipment calculates the eccentricity of the BVH from the acquired image. Here, the computing equipment may be a device including a processor, a memory, a display screen, a user interface (mouse, keyboard, etc.), and the like, and the processor may be a central processing unit (CPU) and/or graphics processing unit (GPU) having an arithmetic function for calculating the eccentricity of the BVH.

As shown in FIG. 6, when it is assumed that a radius of a marker hole 220' of a BVH marker 220 is Ra and a radius of a BVH 210 is Rb, a diameter of the marker hole 220' becomes 2Ra and a radius of the BVH 210 becomes 2Rb. Ra and Rb are values known in advance. In this case, eccentricities Δx and Δy of the BVH may be calculated using Equation 1 below.

[Equation 1]

$$\Delta x = Ra + Rb - X \quad \Delta y = Ra + Rb - Y$$

Here, Δx is a value representing the eccentricity in an x-axis direction of the BVH and denotes a distance value from central coordinates in the x-axis direction of the BVH marker hole 220' to central coordinates in the x-axis direction of the BVH 210.

Δy is a value representing the eccentricity in a y-axis direction of the BVH and denotes a distance value from central coordinates in the y-axis direction of the BVH marker hole 220' to central coordinates in the y-axis direction of the BVH 210.

X denotes a distance value from an end point 211 of the BVH 210 to an end point 221 of the BVH marker hole 220' which faces the end point 211. For example, when the end point 211 of the BVH 210 is an end point in a nine o'clock direction as shown in FIG. 7, the end point 221 of the BVH marker hole 220' may be an end point in a three o'clock direction.

Y denotes a distance value from an end point 212 of the BVH 210 forming a 90° angle with respect to the end point 211 of the BVH 210 to an end point 222 of the BVH marker hole 220' which faces the end point 212. For example, when the end point 211 of the BVH 210 is an end point in a six o'clock direction, the end point 222 of the BVH marker hole 220' may be an end point, which faces the end point in the six o'clock direction, in a twelve o'clock direction.

For the X and Y, when a measurer displays a display bar corresponding to each end point on the image using the user interface (mouse or the like), the processor may calculate pixel coordinates corresponding to the display bar and automatically calculate X and Y using the calculated pixel coordinates.

As described above, the computing equipment connected to the microscope camera may measure the eccentricity of the BVH by calculating a separation distance from the central coordinates of the marker hole to the central coordinates of the BVH and a separation direction using the distance between the end point of the marker hole and the end point of the BVH included in the image.

Meanwhile, in the images of FIGS. 6 and 7, the entire circular shape of the BVH 210 is completely exposed upward through the BVH marker hole 220' of the BVH marker 220, but the degree of eccentricity is severe as shown in No, 3, 4, and 5 of FIG. 5, and thus only a portion of the entire circular shape of the BVH 210 may be exposed upward through the BVH marker hole 220' of the BVH marker 220. In this case, since the measurer cannot display the display bar corresponding to each end point on the image, the X and Y in Equation 1 above cannot be calculated, and thus the eccentricities Δx and Δy of the BVH cannot be calculated.

Figure 8:
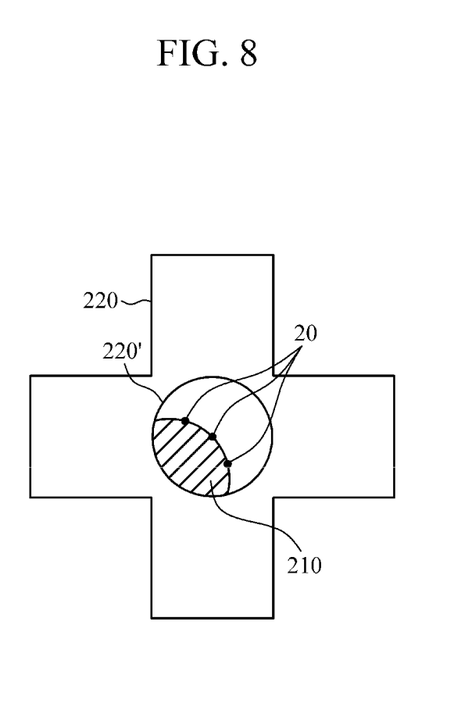
FIG. 8 is a diagram for describing a method of measuring eccentricity of a BVH according to another embodiment of the present invention.

In the above case, as shown in FIG. 8, when the measurer marks at least three marking points 20 on an edge of the BVH 210 that is exposed upward through the BVH marker hole 220' on the image using a user interface (mouse or the like), the processor may calculate a curvature of the BVH 210 using three pixel coordinates corresponding to the three marking points 20. It is also possible to calculate a curvature of the BVH marker hole 220' in the same way.

Thereafter, the processor calculates central coordinates of the BVH 210 from the calculated curvature of the BVH 210 and, similarly, calculates central coordinates of the BVH marker hole 220' from the curvature of the BVH marker hole 220'.

Thereafter, the processor calculates a separation distance and separation direction from the central coordinates of the BVH marker hole 220' to the central coordinates of the BVH 210 and outputs the calculated separation distance and separation direction as the eccentricities of the BVH 210.

The eccentricity of the BVH 210 obtained in the above manner is provided to PCB manufacturers, and the PCB manufacturers adjust process parameters in PCB manufacturing processes on the basis of the eccentricity of the BVH 210 provided by the measurer.

Hereinafter, a procedure for a method of measuring eccentricity of a BVH formed in a PCB will be described.

First, an inner-layer board is manufactured. A material of the inner-layer board may include, for example, a flame retardant (FR) 4 material. The FR4 may be made of glass fiber and epoxy.

Next, an outer-layer board made of a material having a higher expansion rate than that of the inner-layer board is manufactured. The outer-layer board may include, for example, a Teflon board. Here, the Teflon material may be "polytetrafluoroethylene (PTFE)."

The process of manufacturing the outer-layer board forming a top layer and a bottom layer of the inner-layer board may include a process of forming an actual via hole, a process of forming a BVH for measuring a degree of eccentricity of the actual via hole from a center of an annular pad connected to an upper end of the actual via hole, and a process of forming a BVH marker for exposing an upper end of the BVH upward on a surface of the outer-layer board. Since the present invention is not characterized by limiting specific methods for each process, a description of each process is replaced by known technique.

Next, a process of bonding the inner-layer board and the outer-layer board by thermocompression bonding is performed.

Next, a process of acquiring an image of the BVH marker by photographing the BVH marker formed on the surface of the outer-layer board using a microscope camera is performed.

Next, as described in FIGS. 6 and 7, the process of measuring the eccentricity of the BVH 210 from the image of the BVH marker 220 using computing equipment is performed.

Hereinafter, the process of measuring the eccentricity of the BVH 210 will be described in more detail.

The method of measuring the eccentricity according to the present invention is a method of measuring eccentricity of a BVH 210 formed in a PCB including an inner-layer board and an outer-layer board that are bonded by thermocompression bonding, wherein the method includes acquiring, by a microscope camera, an image by photographing a marker 220 which is formed on a surface of the outer-layer board and a BVH 210 which is exposed upward through a marker hole 220' formed in a center of the marker 220 with a microscope camera, and measuring, by computing equipment connected to the microscope camera, eccentricity indicating a separation distance and a separation direction from central coordinates of the marker hole 220' to central coordinates of the BVH 210 using a distance between an end point of the marker hole 220' and an end point of the BVH 210 which are included in the image.

In an embodiment, the measuring of the eccentricity includes measuring a degree (deviation) to which a center of an actual via hole formed in the outer-layer board is eccentric from a center of an annular pad (annular ring).

In another embodiment, in the measuring of the eccentricity, the end point of the marker hole 220' may be an end point facing the end point of the BVH 210.

In still another embodiment, in the measuring of the eccentricity, the eccentricities Ax and Ay are calculated using Equation 1 above. In Equation 1 above, Ra denotes a radius of the marker hole, Rb denotes a radius of the BVH, X denotes a distance value from a first end point of the BVH to a first end point of the marker hole which faces the first end point of the BVH, and Y denotes a distance value from a second end point of the BVH forming a 90° angle with respect to the first end point of the BVH to a second end point of the marker hole which faces the second end point of the BVH. Here, when the first end point of the BVH is an end point in a nine o'clock direction of the BVH, the first end point of the marker hole may be an end point in a three o'clock direction of the marker hole. Further, when the second end point of the BVH is an end point in a six o'clock direction of the BVH, the second end point of the marker hole may be an end point in a twelve o'clock direction of the marker hole.

In yet another embodiment, the measuring of the eccentricity includes marking, by a user interface included in the computing equipment, the end point of the marker hole and the end point of the BVH on the image according to the manipulation of the measurer, calculating, by a processor included in the computing equipment, first pixel coordinates corresponding to the end point of the marker hole and second pixel coordinates corresponding to the end point of the BVH, which are marked on the image, and measuring, by the processor, eccentricity using the radius of the marker hole, the radius of the BVH, and the distance value between the first pixel coordinates and the second pixel coordinates.

In yet another embodiment, the measuring of the eccentricity may include measuring, by the processor included in the computing equipment, the eccentricity using a curvature of the BVH and a curvature of the marker hole which appear on the image when only a portion of an entire circular shape of the BVH is exposed upward by the marker. Here, the measuring of the eccentricity using the curvature of the BVH and the curvature of the marker hole which appear on the image includes marking, by the processor included in the computing equipment, at least three marking points on an edge of the BVH and marking at least three marking points on an edge of the marker hole, which appear on the image according to the manipulation of the measurer, calculating, by the processor included in the computing equipment, the curvature of the s BVH using at least three pixel coordinates corresponding to the at least three marking points marked on the edge of the BVH and calculating the curvature of the marker hole using at least three pixel coordinates corresponding to the at least three marking points marked on the edge of the marker hole, extracting, by the processor, the central coordinates of the BVH on the basis of the calculated curvature of the BVH and extracting the central coordinates of the marker hole on the basis of the calculated curvature of the marker hole, and calculating a separation distance value and a separation direction value between the extracted central coordinates of the BVH and the extracted central coordinates of the marker hole and outputting the calculated separation distance value and the separation direction value as the eccentricities.

The method of measuring the eccentricity of a BVH formed in a PCB described so far may be implemented as a computer-readable recording medium in which a program for implementing the method is stored.

According to the present invention, eccentricity of a BVH can be calculated using a BVH that does not function as an actual via hole in a PCB and a BVH marker formed thereon and process parameters set in the manufacturing process of the PCB can be adjusted based on the calculated eccentricity, and thus it is possible to reduce an electromagnetic wave reflection loss caused by the eccentricity of the via hole.

The above-described embodiments should be considered from an exemplary point of view for description rather than a limiting point of view. The scope of the present invention is indicated in the claims rather than the foregoing description, and all differences within the scope equivalent thereto should be construed as being included in the present invention.

What is claimed is:

1. A method of measuring eccentricity of a blind via hole formed in a printed circuit board including an inner-layer board and an outer-layer board that are bonded by thermocompression bonding, the method comprising:
    acquiring, by a microscope camera, an image by photographing a marker which is formed on a surface of the outer-layer board and a blind via hole which is exposed upward through a marker hole formed in a center of the marker with a microscope camera; and
    measuring, by computing equipment connected to the microscope camera, eccentricity indicating a separation distance and a separation direction from central coordinates of the marker hole to central coordinates of the blind via hole using a distance between an end point of the marker hole and an end point of the blind via hole which are included in the image.

2. The method of claim 1, wherein the measuring of the eccentricity includes measuring a degree to which a center of an actual via hole formed in the outer-layer board is eccentric from a center of an annular pad (annular ring).

3. The method of claim 1, wherein, in the measuring of the eccentricity, the end point of the marker hole is an end point facing the end point of the blind via hole.

4. The method of claim 1, wherein, in the measuring of the eccentricity, the eccentricity ($\Delta x$, $\Delta y$) is calculated using Equations below:

$$\Delta x = Ra + Rb - X \quad \Delta y = Ra + Rb - Y,$$

wherein Ra denotes a radius of the marker hole, Rb denotes a radius of the blind via hole, X denotes a distance value from a first end point of the blind via hole to a first end point of the marker hole which faces the first end point of the blind via hole, and Y denotes a distance value from a second end point of the blind via hole forming a 90° angle with respect to the first end point of the blind via hole to a second end point of the marker hole which faces the second end point of the blind via hole.

5. The method of claim 4, wherein, when the first end point of the blind via hole is an end point in a nine o'clock direction of the blind via hole, the first end point of the marker hole is an end point in a three o'clock direction of the marker hole.

6. The method of claim 4, wherein, when the first end point of the blind via hole is an end point in a six o'clock direction of the blind via hole, the second end point of the marker hole is an end point in a twelve o'clock direction of the marker hole.

7. The method of claim 1, wherein the measuring of the eccentricity includes:
    marking, by a user interface included in the computing equipment, the end point of the marker hole and the end point of the blind via hole on the image according to manipulation of a measurer;
    calculating, by a processor included in the computing equipment, first pixel coordinates corresponding to the end point of the marker hole and second pixel coordinates corresponding to the end point of the blind via hole which are marked on the image; and
    measuring, by the processor, eccentricity using the radius of the marker hole, the radius of the blind via hole, and the separation distance value and the separation direction value between the first pixel coordinates and the second pixel coordinates.

8. The method of claim 1, wherein the measuring of the eccentricity includes measuring, by a processor included in the computing equipment, the eccentricity using a curvature of the blind via hole and a curvature of the marker hole which appear on the image when only a portion of an entire circular shape of the blind via hole is exposed upward by the marker.

9. The method of claim 8, wherein the measuring of the eccentricity using the curvature of the blind via hole and the curvature of the marker hole which appear on the image includes:
    marking, by the processor included in the computing equipment, at least three marking points on an edge of the blind via hole and marking at least three marking points on an edge of the marker hole, which appear on the image according to manipulation of a measurer;
    calculating, by the processor included in the computing equipment, the curvature of the blind via hole using at least three pixel coordinates corresponding to the at least three marking points marked on the edge of the blind via hole and calculating the curvature of the marker hole using at least three pixel coordinates corresponding to the at least three marking points marked on the edge of the marker hole;
    extracting, by the processor, the central coordinates of the blind via hole on the basis of the calculated curvature of the blind via hole and extracting the central coordinates of the marker hole on the basis of the calculated curvature of the marker hole; and
    calculating a separation distance value and a separation direction value between the extracted central coordinates of the blind via hole and the extracted central coordinates of the marker hole and outputting the calculated separation distance value and the separation direction value as the eccentricities.

10. An apparatus for measuring eccentricity of a blind via hole formed in a printed circuit board, which is an apparatus for measuring eccentricity of a blind via hole formed in a printed circuit board including an inner-layer board and an outer-layer board that are bonded by thermocompression bonding, the apparatus comprising:
    a microscope camera configured to acquire an image by photographing a marker which is formed on a surface of the outer-layer board and a blind via hole which is exposed upward through a marker hole formed in a center of the marker with a microscope camera; and
    computing equipment configured to receive the image acquired by the microscope camera and measure eccentricity indicating a separation distance and a separation direction from central coordinates of the marker hole to central coordinates of the blind via hole using a distance between an end point of the marker hole and an end point of the blind via hole which are included in the image.

11. The apparatus of claim 10, wherein the end point of the marker hole is an end point facing the end point of the blind via hole.

12. The apparatus of claim 10, wherein the computing equipment calculates the eccentricity ($\Delta x$, $\Delta y$) using Equations below, $$\Delta x = Ra + Rb - X \quad \Delta y = Ra + Rb - Y,$$

wherein Ra denotes a radius of the marker hole, Rb denotes a radius of the blind via hole, X denotes a distance value from a first end point of the blind via hole to a first end point of the marker hole, which faces the first end point of the blind via hole, and Y denotes a distance value from a second end point of the blind via hole forming a 90° angle with respect to the first end point of the blind via hole to a second end point of the marker hole, which faces the second end point of the blind via hole.

13. The apparatus of claim 10, wherein the computing equipment includes:
- a user interface configured to mark the end point of the marker hole and the end point of the blind via hole on the image according to manipulation of a measurer; and
- a processor configured to calculate first pixel coordinates corresponding to the end point of the marker hole and second pixel coordinates corresponding to the end point of the blind via hole which are marked on the image and measure eccentricity using the radius of the marker hole, the radius of the blind via hole, and the separation distance value and the separation direction value between the first pixel coordinates and the second pixel coordinates.

14. An apparatus for measuring eccentricity of a blind via hole formed in a printed circuit board, which is an apparatus for measuring eccentricity of a blind via hole formed in a printed circuit board including an inner-layer board made of a flame retardant (FR) 4 material and an outer-layer board made of a Teflon material which are bonded by thermocompression bonding, the apparatus comprising:
- a microscope camera configured to acquire an image by photographing a marker which is formed on a surface of the outer-layer board and a blind via hole which is exposed upward through a marker hole formed in a center of the marker with a microscope camera; and
- computing equipment configured to receive the image from the microscope camera and measure eccentricity indicating a separation distance and a separation direction from central coordinates of the marker hole to central coordinates of the blind via hole using a distance between an end point of the marker hole and an end point of the blind via hole which are included in the image,
- wherein the computing equipment measures the eccentricity using a curvature of the blind via hole and a curvature of the marker hole which appear on the image when only a portion of an entire circular shape of the blind via hole is exposed upward by the marker.

15. The apparatus of claim 14, wherein the marker hole photographed by the microscope camera has a cross shape.

16. The apparatus of claim 14, wherein the marker hole has a cross shape.

17. The apparatus of claim 14, wherein the marker photographed by the microscope camera has a lateral length of 1 mm and a longitudinal length of 1 mm.

18. The apparatus of claim 14, wherein the blind via hole photographed by the microscope camera is a dummy via hole.

* * * * *